United States Patent [19]

Shewchuk et al.

[11] Patent Number: 5,075,570
[45] Date of Patent: Dec. 24, 1991

[54] SWITCHING STATE RETENTION CIRCUIT HAVING A FEEDBACK LOOP STABILIZING CAPACITANCE

[75] Inventors: Thomas J. Shewchuk; Billy D. Mills, both of Colorado Springs, Colo.

[73] Assignee: Honeywell Inc., Minneapolis, Minn.

[21] Appl. No.: 125,309

[22] Filed: Nov. 25, 1987

[51] Int. Cl.$^5$ .................. H03K 3/286; H03K 3/037
[52] U.S. Cl. ................................ 307/279; 307/246; 307/308; 307/591; 307/310; 307/451; 307/601
[58] Field of Search ............. 307/246, 591, 443, 601, 307/308, 279, 307, 310; 365/149, 154, 190, 206; 377/79, 104, 105, 115, 117

[56] References Cited

U.S. PATENT DOCUMENTS

| | | | |
|---|---|---|---|
| 3,731,119 | 5/1973 | Matzen | 307/291 |
| 3,786,282 | 1/1974 | Orndorff | 307/291 |
| 4,130,892 | 12/1978 | Gunckell, II et al. | 307/279 |
| 4,418,402 | 11/1983 | Heagerty et al. | 365/156 |
| 4,590,508 | 5/1986 | Hirakawa et al. | 357/41 |
| 4,596,939 | 6/1986 | Yamada | 307/279 |
| 4,641,165 | 2/1987 | Iizuka et al. | 357/23 |
| 4,670,670 | 6/1987 | Shoji | 307/308 |
| 4,685,197 | 8/1987 | Tigelaar et al. | 357/51 |
| 4,725,981 | 2/1988 | Rutledge | 365/190 |
| 4,760,557 | 7/1988 | Stewart et al. | 307/279 |
| 4,782,467 | 11/1988 | Belt et al. | 307/279 |
| 4,785,200 | 11/1988 | Hungtinton | 307/279 |

FOREIGN PATENT DOCUMENTS 0239660 10/1986 Japan .................. 357/45

OTHER PUBLICATIONS

"CMOS Logic Performance Characteristics and Circuit Applications", *User's Guidebook to Digital CMOS Integrated Circuits*, E. R. Hnatek, pp. 34-38 (1981).

*Primary Examiner*—Stanley D. Miller
*Assistant Examiner*—Tai V. Duong
*Attorney, Agent, or Firm*—Theodore F. Neils

[57] ABSTRACT

An improvement in a switching state retention circuit of adding a shunt capacitance across an inverter output in a selectable feedback loop. The circuit has a controlled inverter connected to both the selectively connected feedback loop and an output inverter. The shunt capacitance is across an inverter in the feedback loop to control propagation delay therearound without slowing state changes at the output of the circuit.

7 Claims, 2 Drawing Sheets

SWITCHING STATE RETENTION CIRCUIT HAVING A FEEDBACK LOOP STABILIZING CAPACITANCE

BACKGROUND OF THE INVENTION

The present invention relates to switching state retention circuits of the kind permitting a switching state at the input thereof to appear at the output thereof only after an enabling signal has permitted such a result and, more particularly, such switching state retention circuits which are formed by use of a feedback loop path arrangement.

There are many uses in digital systems for D-type flip-flops, i.e. data latches. Such latches are used frequently to store a signal value representing data received at a data input for a duration of time after an enabling signal of a particular logic value has also been received at an enable input. This is useful, for instance, in permitting subsequent portions of the digital system to operate on a fixed value signal at the output of the latch even though further changes are occurring at the latch data input.

For the representation shown in FIG. 1 of such a D-type flip-flop, 10, the typical operating arrangement has the enable input, 11, at the "1" logic value if the signal values occurring on the data input, 12, are (i) to be presented at the latch output, 13, as they occur at input 12, but (ii) to not be stored and presented as stored at the latch output 13 despite logic state changes subsequently occurring at input 12. Alternatively, the "0" logic value is provided at enable input 11 if a logic signal on data input 12 is to be stored and a representation thereof presented at output 13, with output 13 thereafter remaining fixed at this logic state value occurring at data input 12 just before the logic value at enable input 11 went to this "0" logic state.

A common way of implementing the D-type latch of FIG. 1 is shown in the logic symbol system diagram of FIG. 2A, particularly if implemented in complementary metal-oxide-semiconductor (CMOS) technology, i.e. based on using p-channel and n-channel metal-oxide-semiconductor field-effect transistor (MOSFET) pairs as the active components in the circuit. The same designation numerals are used in FIG. 2A for the inputs and outputs there as are used for the corresponding inputs and outputs in FIG. 1.

Data input 12 in FIG. 2A is connected to the input of a controlled data propagation inverter, 14. Inverter 14 is controlled by enabling signals applied to input 11, as in FIG. 1, and to a further input, 11'. The signal at input 11' is just the logical complement of that at input 11 and so can be provided by merely connecting an inverter between input 11 and input 11' to exactly duplicate the situation of FIG. 1. However, for clarity purposes, two separate inputs are shown in FIG. 2A. The logic signal to be provided at input 11 will be designated as the ENABLE signal while that to be provided at input 11' will be designated as the ENABLE' as the logical complement signal.

If the ENABLE signal at input 11 takes a logical "1" value, so that complementary signal ENABLE' has a logical "0" value, whatever logic state value appears at data input 12 will appear inverted, i.e. the opposite state, at a circuit node, 15, to which the output of controlled inverter 14 is connected, at least after the propagation delay through inverter 14. If, on the other hand, the logic state values are reversed at inputs 11 and 11', from those just described, any changes in logic states subsequently occurring at data input 12 will have no further effect on the logic state present at the output of controlled inverter 14, and so at circuit node 15, until yet another such logic state reversal. That is, the output of inverter 14 is isolated from logic state changes on data input 12 in this latter situation.

Also connected to node 15 is the input of a further inverter, 16. The output of inverter 16 is connected to the input of yet another inverter, 17. Inverters 16 and 17 are ordinary logic inverters. If they are each electrically energized, the output of each will be at a logic state value opposite that appearing at the input thereof.

The output of inverter 17 is connected to the input of a transmission gate, 18. The output of transmission gate 18 is, in turn, connected to circuit node 15 to thereby form a feedback path arrangement, or feedback loop, from node 15 through inverters 16 and 17, through transmission gate 18, and back to node 15.

Transmission gate 18 can be directed by the ENABLE and the ENABLE' signals to provide a low impedance, i.e. high conductivity, electrical circuit path between the input and the output of this transmission gate. This occurs when the signal ENABLE at input 11 is in the "0" logic state and the signal ENABLE' at input 11' is in the "1" logic state. Alternatively, these signals can direct transmission gate 18 to have a high impedance, i.e. low conductivity, electrical circuit path between the input and the output thereof. This occurs when the logic state values at inputs 11 and 11' are the reverse of those described for the high conductivity situation. Thus, transmission gate 18 provides a highly conductive circuit path (acting as a closed switch) substantially only if the logic state on the output of controlled inverter 14 is independent of the signal occurring at data input 12, but provides a low conductivity path (acting as an open switch) substantially only if the logic state values on the output of controlled inverter 14 follow those occurring on data input 12.

Finally, node 15 in the circuit of FIG. 2A has the input of a further ordinary inverter, 19, connected thereto. The output of inverter 19 is in turn connected to latch output 13.

In operation, the provision of a logic "1" for the ENABLE signal at input 11 and a logic "0" for the ENABLE' signal at input 11' leads to the logic state values occurring at latch data input 12 being provided to inverted circuit node 15 at the output of controlled inverter 14 after the propagation delay through inverter 14. Such logic state values provided at circuit node 15 will result in the opposite logic state values occurring at the output of inverter 16, and so at the input of inverter 17. Inverter 17 will invert these logic state values again as they appear at its output.

Thus, the same logic state values that occur at circuit node 15 will also occur at the output of inverter 17 after propagation through inverters 16 and 17 which are opposite to those occurring on data latch data input 12. The time a logic state change on data input 12 takes to propagate to the output of inverter 17 is the "setup time." However, the logic states at the output of inverter 17 will have no effect on circuit node 15 as transmission gate 18, for these values of the signals ENABLE and ENABLE', will be in a low conductivity state. This prevents the logic state values occurring at the output of inverter 17 from affecting circuit node 15 in any significant way since there is, in effect, no circuit path from the output of inverter 17 to circuit node 15.

Because of the inversion action of inverter 19, logic state values appearing at circuit node 15 will lead to the opposite logic state appearing at the output of inverter 19, and so at latch output 13. Thus, the logic state occurring on latch output 13 will be just that occurring on data input 12 after the propagation delays through controlled inverter 14 and inverter 19.

Alternatively, if the logic values for the ENABLE signal and the ENABLE' logic signal reverse so that ENABLE has a "0" value and ENABLE' has a "1" value, the logic state occurring on circuit node 15 after this reversal will no longer be affected by the logic states occurring at data input 12 but, at least initially, will be an inverted version of that which was present on data input 12 at the time of such logic state value reversal in the enabling signals. This logic state value is initially maintained at the output of inverter 14, and at circuit node 15, at least temporarily because of the charging of the parasitic capacitances associated with circuit node 15. This reversal of the logic state values of the enabling signals also switches transmission gate 18 into the high conductivity state (during the "hold time" between this reversal and the output of inverter 14 becoming isolated from its input) so that the logic state occurring at the output of inverter 17 is now applied to circuit node 15. The "hold time" must elapse after a logic state change occurs on terminal 12 to be certain that the inverted logic state is established on node 15. As described just above, the logic state value occurring at the output of inverter 17 is just that occurring at circuit node 15 so that they are consistent with one another (if the "setup time" has elapsed which is the time between a logic state change occurring on terminal 12 until the logic state change is propagated through to the output of inverter 17, and this time must elapse after a logic state change occurs on terminal 12 before an isolation of the output of inverter 14 occurs if the logic state on terminal 12 is to be stored certainly). This common logic state on node 15 and at the output of inverter 17 is maintained because of the one reinforcing the other due to the feedback path arrangements through inverters 16 and 17 and transmission gate 18.

The actual CMOS technology implementation of the logic symbol system of FIG. 2A is shown in FIG. 2B. Controlled inverter 14 is formed of first and second p-channel MOSFET's, 20 and 21. The source of transistor 20 is electrically connected to a terminal means, 22, adapted for connection to a source of positive voltage.

The drain of transistor 20 is electrically connected to the source of transistor 21. The drain of transistor 21 is electrically connected to one of two n-channel MOSFET's, 23 and 24, which are also part of controlled inverter 14. The drain of transistor 21 is electrically connected to the drain of transistor 23 to form the output of controlled inverter 14. The source of transistor 23 is electrically connected to the drain of transistor 24. The source of transistor 24 is electrically connected to a terminal means, 25, adapted for connection to the ground reference voltage.

The gates of transistors 20 and 24 are electrically connected together, to form the input of controlled inverter 14, and to data latch data input terminal 12. The gate of transistor 21 is electrically connected to input 11' at which the signal ENABLE' is provided. The gate of transistor 23 is electrically connected to input 11 at which the signal ENABLE is provided. Thus, p-channel MOSFET 21 and n-channel MOSFET 23 together serve to either (i) isolate, through being switched to the "off" condition, the output of controlled inverter 14, connected to circuit node 15, from electrical changes occurring in p-channel MOSFET 20 and n-channel MOSFET 24 as a result of being controlled by logic signals at latch data input 12, or (ii) to connect, through being switched to the "on" condition, the drains of MOSFET's 20 and 24 to the output of controlled inverter 14 and so to circuit node 15.

Inverter 16 is shown formed with a p-channel MOSFET, 26, and a n-channel MOSFET 27. The source of transistor 26 is electrically connected to terminal means 22 while the source of transistor 27 is electrically connected to terminal means 25. The drains of transistors 26 and 27 are electrically connected together to form the output of inverter 16, as are the gates of these two transistors, to form the input of inverter 16, which gates in turn are electrically connected to circuit node 15.

Inverter 17 is similarly shown in FIG. 2B formed of a p-channel MOSFET, 28, and a n-channel MOSFET, 29. The source of transistor 28 is electrically connected to terminal means 22 and the source of transistor 29 is electrically connected to terminal means 25. The drains of transistors 28 and 29 are electrically connected together to form the output of inverter 17, and so are the gates of these transistors, to form the input of inverter 17, these gates also being electrically connected to the common drains of transistors 26 and 27 forming the output of inverter 16.

Transmission gate 18 is shown in FIG. 2B formed of a p-channel MOSFET, 30, and a n-channel MOSFET, 31. The lower terminating regions in that figure of each of MOSFET's 30 and 31, serving as source and drain, are electrically connected to one another and to the common drain regions of transistors 28 and 29 forming the output of inverter 17. The upper terminating regions in FIG. 2B of MOSFET's 30 and 31, also serving as a source and drain, are electrically connected to one another and to circuit node 15.

Finally, inverter 19 is formed of a p-channel MOSFET, 32, and a n-channel MOSFET, 33. The source of transistor 32 is electrically connected to terminal means 22 and the source of transistor 33 is electrically connected to terminal means 25. The drains of transistors 32 and 33 are electrically connected to one another, to form the output of inverter 19, and to latch output 13. The gates of transistors 32 and 33 are electrically connected to one another, to form the input of inverter 19, and to circuit node 15. The substrates of all of the MOSFET's shown in FIG. 2B have the usual electrical connections even though, to maintain clarity, they are not explicitly shown in that figure: the substrates of all the p-channel MOSFET's are electrically connected to terminal means 22 while the substrates of all of the n-channel MOSFET's are electrically connected to terminal means 25.

Inverters 16, 17 and 19, and the inverter formed by MOSFET's 20 and 24 considered together as part of controlled inverter 14 (with MOSFET's 21 and 23 in the "on" condition), operate in a conventional manner for logic inverters. That is, a low voltage logic state at the common drain output (separated by MOSFET's 21 and 23 in the case of inverter 14) for each inverter results from a high voltage logic state occurring on the common gate input thereof. This occurs through the n-channel transistor in each being in the "on" condition and the p-channel transistor in each being in the "off"

condition. Conversely, a high voltage logic state at the common drain output for each, as the result of a low voltage logic state at the common gate input of each results from the n-channel transistor in each inverter being in the "off" condition and the p-channel transistor in each being in the "on" condition.

Transmission gate 18 is in the high conductivity transmission condition, between the two commonly connected pairs of terminating regions of its constituent MOSFET's, if the high voltage logic state occurs on input 11' and the low voltage logic state occurs on input 11. Then one or the other of MOSFET's 30 and 31, or both, are in the "on" condition, and for the small voltages which will occur across gate 18 in this circuit both of these MOSFET's will always be on in these circumstances. Reversing of the high and low voltage logic states on inputs 11 and 11' leads to transmission gate 18 being in the low conductivity condition between these common pairs of terminating regions. In this situation, MOSFET's 30 and 31 are always in the "off" condition. Thus, the circuit shown in FIG. 2B operates just in the manner described for the logic diagram system of FIG. 2A.

In the situation where MOSFET's 21 and 23 are in the "off" condition, the voltage at circuit node 15 is an inverted version of that of the logic state occurring at data latch data input 12 at the time that these transistors were switched into the "off" condition (assuming that the "hold time" and the "setup time" have each elapsed since the logic state change on terminal 12). This voltage is maintained by the feedback action of inverters 16 and 17 and transmission gate 18 in the feedback path arrangement as described above.

If, in this situation, the voltage at node 15 is that of the low voltage logic state, or "0" state, there will be a large voltage on the drain of "off" p-channel MOSFET 21 with respect to its substrate, the result being a substantial reverse bias voltage on the associated drain-substrate semiconductor pn junction. On the other hand, there will be relatively little reverse bias voltage across the drain-substrate junction of n-channel MOSFET 23 in the "off" condition.

If, alternatively, circuit node 15 is in the high voltage logic state, or "1" state, the reverse situation occurs. The drain-substrate semiconductor pn junction of "off" p-channel MOSFET 21 has relatively little reverse voltage bias. On the other hand, the drain-substrate junction of "off" n-channel MOSFET 23 has a relatively large reverse bias voltage thereon.

Similar statements are true at the common drain outputs of inverters 16 and 17. That is, since the electrically common drains of p-channel MOSFET 26 and n-channel MOSFET 27, together serving as an output for inverter 16, will always be in a logic state opposite that of circuit node 15, the drain-substrate semiconductor pn junction of transistor 26 will always have a large reverse bias thereon if the drain-substrate semiconductor pn junction of "off" p-channel MOSFET 21 has a relatively low reverse bias voltage on its corresponding junction. This is because circuit node 15 is in the high voltage level logic state thereby switching MOSFET 26 into the "off" condition. This statement concerning relative junction voltages is true, of course, only if any previous transient events occurring in the feedback path arrangement have fully propagated around this arrangement so that circuit node 15 voltages have reached stable values following the last preceding transient event.

On the other hand, there will be even less of a reverse bias voltage across the drain-substrate junction of n-channel MOSFET 27 than would occur in this circumstance across the drain-substrate junction of "off" p-channel MOSFET 21 because MOSFET 27 will be in the "on" condition. Of course, n-channel MOSFET 23 has a correspondingly large reverse bias voltage on its drain-substrate junction.

If circuit node 15, alternatively, is at a low voltage logic state, there will be a large reverse bias voltage across the drain-substrate semiconductor pn junction of MOSFET 27 which will be in the "off" condition. There will be a relatively small reverse bias voltage across the corresponding junction of "off" n-channel MOSFET 23. An even smaller reverse bias voltage will occur across the drain-substrate junction of p-channel MOSFET 26 because it will be switched into the "on" condition. There will, of course, be a correspondingly large reverse bias voltage across the drain-substrate junction of "off" p-channel MOSFET 21.

Further along the feedback path arrangement, the common drains of p-channel MOSFET 28 and n-channel MOSFET 29, serving as the output of inverter 17, will as previously described be in the same logic state as is circuit node 15. Thus, for a high voltage level logic state occurring on circuit node 15, there will be a relatively high reverse bias voltage across the drain-substrate junctions of both "off" n-channel MOSFET 23 and n-channel MOSFET 29 which will have been switched into the "off" condition also. There will be, however, an even smaller reverse bias voltage across the drain-substrate semiconductor pn junction of p-channel MOSFET 28 than there will be across the corresponding junction of "off" p-channel MOSFET 21 because MOSFET 28 will have been switched into the "on" condition.

The reverse of this situation will occur if circuit node 15 is in the low voltage level logic state. In this situation, p-channel MOSFET 28 will have been switched into the "off" condition and there will be a relatively large reverse bias voltage across the drain-substrate junction of MOSFET 28 and "off" p-channel MOSFET 21. There will correspondingly be a relatively low reverse bias voltage condition across the drain-substrate junctions of "off" n-channel MOSFET 23 and n-channel MOSFET 29, with the reverse bias voltage across MOSFET 29 being less than that of MOSFET 23 because MOSFET 29 will have been switched into the "on" condition.

As the foregoing description of drain-substrate semiconductor pn junctions demonstrates, there will always be at least one drain-substrate junction subjected to a substantial reverse bias voltage in the MOSFET devices used in inverters 16 and 17, and in controlled inverter 14, in situations where the enabling signals have switched MOSFET's 21 and 23 into the "off" condition to isolate the output of controlled inverter 14. In such situations, as previously explained, the logic state at circuit node 15 is that state which was present on latch input 12 at the switching of MOSFET's 21 and 23 into the "off" condition, and is maintained by the feedback path arrangement involving inverters 16 and 17 and transmission gate 18. This is a stable situation, and is one which will endure until the next switching of conditions of MOSFET's 21 and 23. At least this is true unless some transient event occurs leading to a decrease in such substantial reverse voltage bias of these semiconductor pn junctions which is of a sufficient duration to permit this transient result to propagate around the feedback path arrangement.

That is, if a substantially reverse biased drain-substrate junction suffers a significant reduction in the reverse bias voltage thereacross, and that reduction as a transient event propagates around the feedback path arrangement back to that junction to cause a further drop, the feedback path arrangement will reinforce this reduction to result in a change in logic state at circuit node 15. A source of such a transient event is the occurrence of a charge generating disturbance near such a reverse biased junction. Such disturbances are typically localized near the region where the disturbance is generated and is a temporary event; thus, such a disturbance is often termed a "single event upset."

A common source of such charge generating disturbances is particle radiation. Such particles impinging on a monolithic integrated circuit chip, will have "interactions" with the semiconductor material lattice structure and electrons along the paths thereof through the integrated circuit semiconductor material. This will result in raising the energy of the electrons involved into the conduction band and leaving corresponding holes in the valence band. Should such electron-hole pairs be generated sufficiently close to one of the reverse biased semiconductor pn junctions of the circuit of FIG. 2B, for instance, the electrons and holes so situated are subject to being collected by the action of electric fields in the region due to the reverse bias voltage thereacross and because of diffusion toward such a junction. The electrons and corresponding holes will be separated by the electric fields near the junction with the electrons attracted to the positive voltage side of the junction and the holes being attracted, or repelled, into the portions of the semiconductor material on the other side of the junction. This separation of electrons and holes, in effect, provides a temporary current flow from the positive voltage side of the semiconductor pn junction to the opposite side of this junction or, in effect, a radiation induced leakage current.

This current will be comprised of an immediate drift current component for electrons and holes which are immediately subject to such electric fields. A further component of this current will be provided by those electrons and holes which subsequently, by diffusion, move to be within the influence of such electric fields. Such current flows have the effect of discharging an n-type conductivity region placed at a positive voltage which gives it a reverse voltage bias with respect to a p-type conductivity region on the other side of the junction. Such a discharge current reduces this positive voltage. Conversely, such currents tend to charge a p-type conductivity region placed at a negative voltage to provide a reverse bias of that region with respect to a n-type conductivity region on the other side of the semiconductor pn junction. Such a charging acts to reduce the negative voltage to thereby reduce the reverse bias across that junction. Thus, in either situation, the charge generated by an impinging radiation particle would act in a manner to tend to reduce the magnitude of reverse bias voltages provided across substantially reverse biased semiconductor pn junctions separating p-type conductivity and n-type conductivity regions suffering such an impingement.

The effects of radiation particle impingement on regions of semiconductor material near a reverse biased semiconductor pn junction are a bit less severe for CMOS technology because either the n-channel MOSFET or the p-channel MOSFET in each pair will be formed in a "well" in the semiconductor material substrate, while the remaining member of the pair will be formed directly in the substrate. The devices provided directly in the substrate will have all of the risks for reverse biased semiconductor junctions therein due to radiation particle impingement thereabout as were described above. The other devices formed in "wells" in the semiconductor substrates will have some of the charge induced therein attracted or repelled by the fields at the semiconductor pn junction separating the well from the substrate and therefore will not all be affected by the electrical fields near the semiconductor pn junction separating the device drain region from the well.

Nevertheless, radiation particle impingement on a reverse biased drain region of either a n-channel or p-channel MOSFET, with the resulting reduction in the associated reverse bias voltage, poses a risk of a logic state change at circuit node 15 if this voltage reduction is propagated around the feedback path arrangement before the reverse bias voltage across the affected drain-substrate junction has sufficiently recovered its former value (assuming that the ENABLE signal is such that the feedback path has been established). This is a significant concern for use of the circuit of FIG. 2B in an environment in which significant particle radiation will occur.

A measure which has been used to reduce the rate of propagation of such a voltage reduction event about the feedback path arrangement has been the insertion of a resistance, 34, shown in dashed lines between the output of inverter 16 and the input of inverter 17 in FIGS. 2A and 2B. Resistance 34 is typically of a substantially high value which, combined with the parasitic capacitances at the gates of the MOSFET's in inverter 17, provides an increased time constant for transients in the feedback path arrangement. This results in an increase in the amount of time it takes for such a transient event to propagate around this feedback path arrangement.

However, the forming of a structure having a high value resistance for resistance 34 in CMOS technology in monolithic integrated circuits has a number of problems. As a result, often the only satisfactory way of forming a structure of a high resistance value in many fabrication processes is to form a polycrystalline silicon ("polysilicon") deposition which is relatively lightly doped with impurities to provide a high resistivity material which can then be formed into such a resistance.

However, such resistances are difficult to control in fabrication and so have a substantial variability in the resistance value achieved, and furthermore, have a substantial negative temperature coefficient of resistance. This means that the time constant about the feedback path arrangement decreases at higher temperatures because the resistance value of resistance 34 decreases. Such a result is undesirable because the current which can be supplied for a voltage recovery by circuit MOSFET's to a drain region which has suffered a radiation particle impingement with a resulting reverse bias voltage reduction cannot be as great at higher temperatures. This is because these MOSFET's controlling such current are able to only provide smaller currents at higher temperatures due to electron and hole mobilities decreasing at higher temperatures leading to greater "on" resistances in those MOSFET's in the "on" condition. This results in a lower effective channel conductance for a given gate voltage supplied for switching a MOSFET into, or keeping it in, the "on" condition.

Because the value of such resistance changes so greatly with temperature, the resistance value of resistance 34 also decreases substantially at lower temperatures, and may increase by an order of magnitude at lower temperatures. Such a result means a much larger time constant for signal propagations about the feedback path arrangement at these temperatures. This means there will be a considerable increase in the "setup" time which, as indicated above, is the time after a logic state has appeared at latch input 12 during which the enabling signals must not switch transistors 21 and 23 into the "off" condition to assure that the logic state occurring at latch input 12 has propagated around the feedback path arrangement to the output of inverter 17 so that this logic state will continue after the enabling signals isolate this feedback path arrangement from latch input 12. Such a result reduces the rate at which logic states can be changed and held in the D-type latch of FIGS. 2A and 2B which may reduce the rapidity of operations in a digital system using such a latch.

Thus, a D-type latch using a multiple inverter feedback arrangement would be desirable which is more resistant to single event upsets due to charge generating disturbances occurring in reverse bias drain-substrate semiconductor pn junctions. Further, such a latch should be able to perform in a similar manner in various portions of a substantial range of temperatures, and be conveniently provided in a monolithic integrated circuit.

SUMMARY OF THE INVENTION

The present invention provides an improvement on switching state retention circuits having a loop access means capable of establishing a logic state at an initial device in a plurality of loop device means connected in series with one another and in series with a transmission switch means connected in turn to the initial loop device means, the improvement being the addition of a shunt capacitance at the output of the loop access means. Typically, shunt capacitance is added between the last of the loop access means and the transmission gate.

DETAILED DESCRIPTION OF THE PREFERRED EMBODIMENTS

Figure 1:
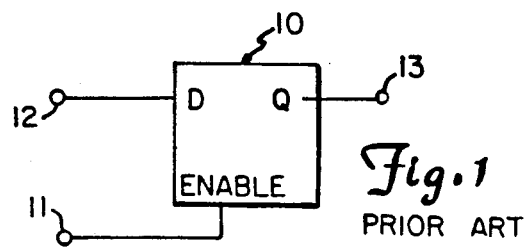
FIG. 1 shows a logic symbol for a prior art D-type flip-flop or data latch.
Figure 2A:
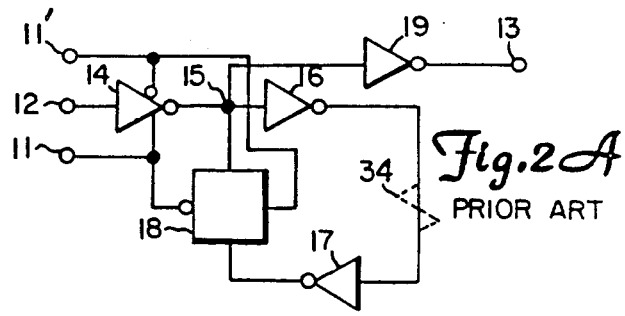
FIG. 2A shows the logic symbol diagram for a prior art implementation of the latch of FIG. 1.
Figure 2B:
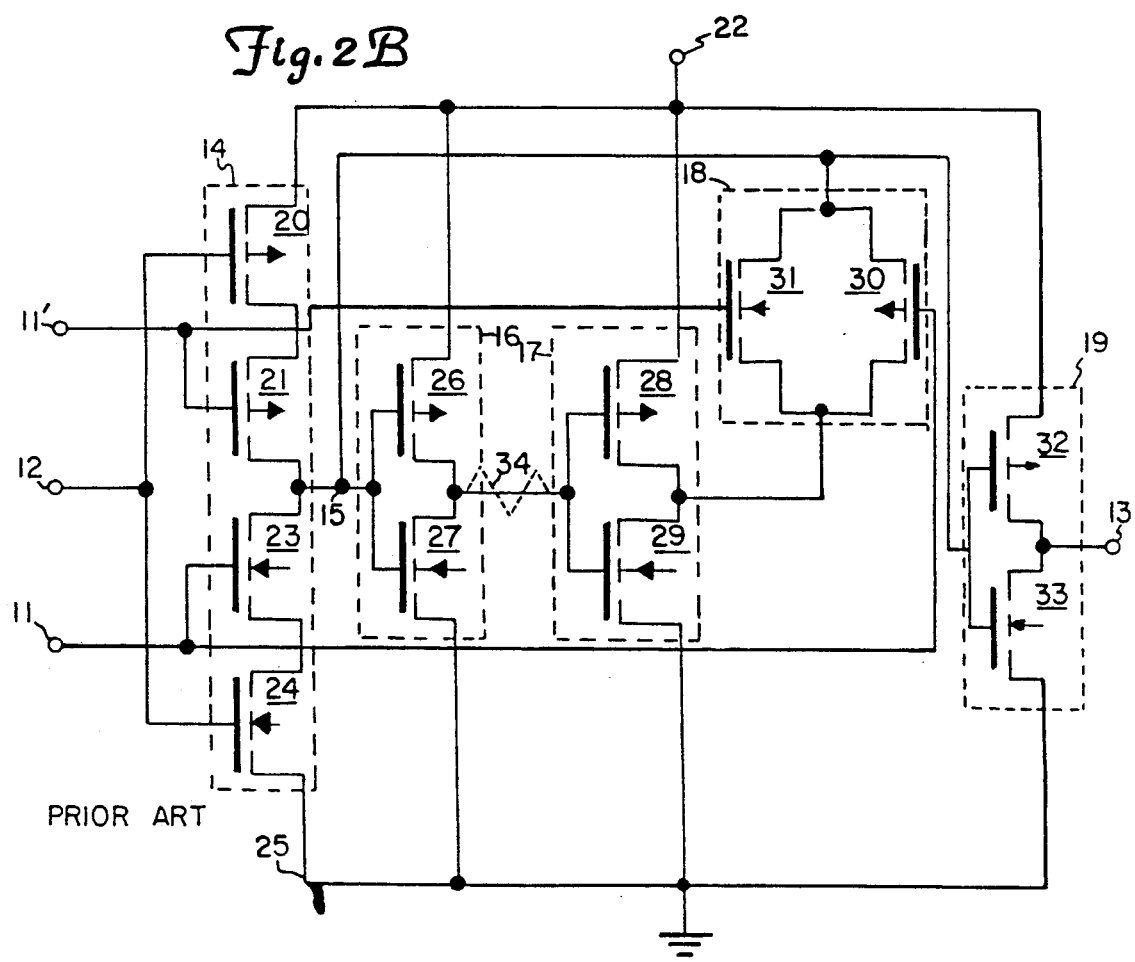
FIG. 2B shows a prior art circuit schematic diagram implementation for the logic symbol diagram of FIG. 2A.
Figure 3A:
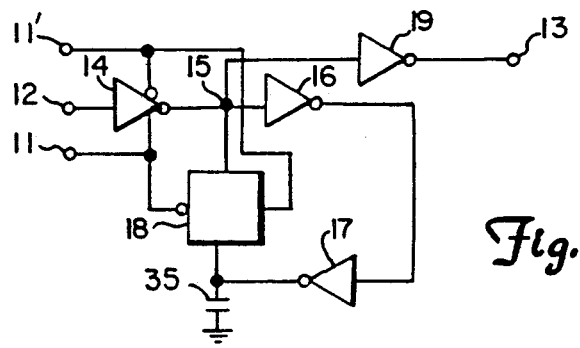
FIG. 3A shows a logic symbol diagram of an improvement over the latch of FIGS. 2A and 2B.
Figure 3B:
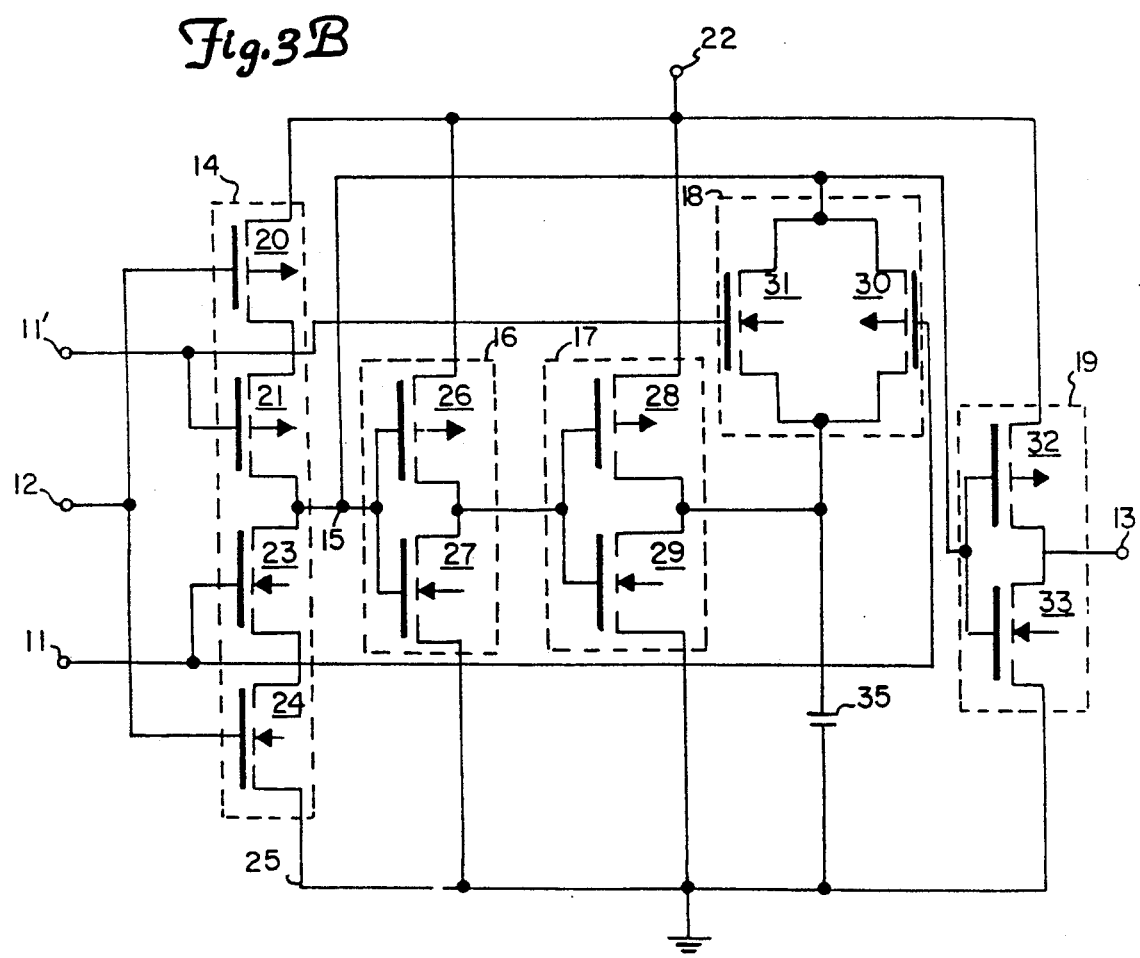
FIG. 3B shows a circuit schematic diagram implementation of the logic symbol diagram of FIG. 3A.

FIGS. 3A and 3B show a logic symbol diagram and a CMOS technology circuit schematic diagram implementation of the D-type flip-flop, or data latch, of FIGS. 1, 2A and 2B with an improvement thereto. This improvement makes the resulting latch more resistant to erroneous operation due to charge disturbances nearby in the monolithic integrated circuit chip in which it is formed. Such charge disturbances are typically generated by particle radiation impacts on reverse biased drain regions occurring in the inverters therein.

The same numerical designations have been used in FIGS. 3A and 3B for the logic diagram symbols and the circuit components shown there which serve the same functions as corresponding components in FIGS. 2A and 2B. Again, even though not shown, all of the p-channel MOSFET's have their substrates electrically connected to terminal means 22 and all of the n-channel MOSFET's have their substrates electrically connected to terminal means 25.

As described in connection with FIG. 2B, controlled inverter 14 and ordinary inverters 16 and 17 each have at least one reverse biased drain-substrate semiconductor pn junction in the MOSFET's used therein for whichever of the two possible logic states have been established at circuit node 15. Thus, each of these nodes is subject to having a reduction in the magnitude of the voltage occurring on the drain region with respect to the substrate of such reverse biased drain-substrate semiconductor pn junctions if charge disturbances occur nearby, i.e. a radiation particle impinging on the drain region. Such an impingement is especially likely to lead to an error in the operation of the latch in those situations where the enabling signals have placed MOSFET's 21 and 23 of controlled inverter 14 in the "off" condition to isolate the output of the inverter from logic state changes of its input to thereby store a logic state through use of the feedback path arrangement of inverters 16 and 17, and transmission gate 18. However, the reverse biased drain-substrate junctions in each of these inverters do not place the latch equally at risk of erroneous operation with respect to the occurrence of a charge generating disturbance hereby in the chip.

As indicated in connection with the description of the circuit of FIG. 2B, there is a reverse biased semiconductor pn junction between the drain and the substrate of each of inverters 16 and 17 for either logic state occurring at circuit node 15. A radiation particle impinging on such a drain region can lead to a sharp voltage reduction in the reverse bias voltage across such a semiconductor pn junction. However, such a drain region will be quickly restored to its former voltage condition before the impingement because of being in series with an "on" MOSFET connected to either terminal means 22 or terminal means 25. Thus, the recovery will be relatively rapid and the voltage disturbance is relatively unlikely to propagate about the loop before the drain region voltage substantially recovers.

On the other hand, the impingement of a radiation particle on the drains of either of "off" transistors 21 and 23 having a large reverse bias voltage across its associated pn junction can lead to a similar sharp reduction in the magnitude of this voltage, but this bias voltage will not recover its former value nearly so quickly. This is because the current supplying or removing the charge for doing so, with both MOSFET's 21 and 23 being switched into the "off" condition, must come from the output of inverter 17 formed by the commonly connected drains of MOSFET's 28 and 29, and then must pass through transmission gate 18. Thus, the current flow must not only be through the "on" condition resistance of whichever of MOSFET's 28 and 29 are in the "on" condition for the logic states present, but also through the "on" condition resistances of MOSFET's 30 and 31 together providing (although only one may be doing so significantly) a relatively high conductivity connection to circuit node 15.

A capacitance, 35, has been added to the feedback path arrangement of FIGS. 2A and 2B and shown in FIGS. 3A and 3B to increase the time constant of the feedback path arrangement. This addition will also slow the propagation around this feedback path arrangement of voltage changes at circuit nodes due to transient charge generating occurrences.

Such a capacitance has been shown shunting the output of inverter 17 to terminal means 25. Further capacitance can also be added shunting the output of inverter 16, or could entirely supplant that at the output of inverter 17 if this was the only purpose for doing so. However, because circuit node 15 provides a greater risk of having a voltage change caused by a transient event propagate around the feedback path arrangement before the voltage recovers at node 15, capacitance 35 has been shown placed shunting the output of inverter 17.

Capacitance 35 could, of course, be placed between node 15 and terminal 25 to directly support the voltage states occurring thereon. However, such a placement for capacitance 35 would slow the propagation of a logic state change occurring at data latch data input 12 to the output 13.

Placing capacitance 35 to shunt the output of inverter 17 assures a supply of a substantial amount of positive or negative charge being available to form a current through transmission gate 18 to quickly aid inverter 17 in restoring the voltage on circuit node 15 by also supplying charge to, or removing charge from, as appropriate, the drain region connected thereto suffering the reduction in reverse bias voltage. Yet, this placement does not slow logic state change propagation from the data latch input 12 to its output 13. Thus, capacitance 35 is in a position at the output of inverter 17 to directly aid that circuit node which, if it suffers a reduction in voltage thereon because of a radiation particle impingement in a drain region connected thereto, provides the greatest risk of having that voltage reduction propagate around the feedback path arrangement sufficiently rapidly to cause a logic state change at the circuit nodes therein to an erroneous logic state.

The value of capacitance chosen for capacitance 35 depends on the "on" resistances of MOSFET's 28 through 31, the parasitic capacitance resulting on node 15, and the time required for a logic state change on node 15 to propagate to the output of inverter 17. Smaller values of "on" resistance for MOSFET's 28 through 31 permits a smaller capacitance value for capacitance 35 since the charge stored on capacitance 35 can transfer more quickly to offset the effect of a radiation particle impingement on drain regions connected to circuit node 15. The "on" resistances of these MOSFET's are therefore kept low by increasing the width-to-length ratios thereof.

The parasitic capacitance resulting about node 15 acts to support these voltage logic states occurring thereon and, to the extent that such capacitances are there, the capacitance value of capacitance 35 can be correspondingly decreased. On the other hand, as indicated above, additional capacitance on node 15 reduces the propagation time of logic states occurring on data latch input 12 to output 13 thereof. Thus, there is a desire to avoid any design for the integrated circuit implementation of the circuit in FIG. 3B which would increase the parasitic capacitance about node 15.

Finally, the longer the propagation delay around the feedback loop arrangement from node 15 to the output of inverter 17, the smaller the capacitance value needed for capacitance 35. This follows since node 15 then has more time to recover from the effects of a radiation particle impingement before an erroneous logic state can propagate about the feedback loop to reinforce the erroneous state occurring on node 15 as a result of the impingement.

The foregoing factors affecting the capacitance value of capacitance 35 are, of course, interrelated. As a result, the selection of the capacitance value for capacitance 35 must be made taking into account the actual parameters occurring in a particular integrated circuit design using the circuit shown in FIG. 3B.

The use of capacitance 35, rather than resistance 34, to increase the feedback path arrangement time constant has the further benefit of providing a time constant which, rather than decreasing with temperature, increases with temperature to thereby compensate for the reduced current providing capabilities of the inverters at higher temperatures because of decreasing hole and electron mobilities in the MOSFET's therein as explained above. This is because the "on" resistances of the MOSFET's used therein increase with temperature, and this increase is not overwhelmed by the much greater decrease in resistance value which occurred with the use of resistance 34 formed as a lightly doped polysilicon deposited resistor. The capacitance value of capacitance 35 changes relatively little with temperature whether formed by two doped polysilicon layers separated by an insulator or by a single doped polysilicon layer separated by an insulator from a region of doped semiconductor material. Thus, the increasing resistance value of the MOSFET "on" resistances with temperature assures an increase in the time constant of the feedback path arrangement.

The increasing of the time constant of the feedback path arrangement to increase disturbance propagation times therealong also lengthens the "setup time," described above, which is the time duration between the occurrence of a change in logic state on latch input 12 and the corresponding change occurring at the output of inverter 17. This output cannot change until capacitance 35 is correspondingly charged which lengthens this time duration. However, the setup time does not greatly lengthen at lower temperatures because the "on" resistances of the MOSFET's decrease in value.

Although the present invention has been described with reference to preferred embodiments, workers skilled in the art will recognize that changes may be made in form and detail without departing from the spirit and scope of the invention.

What is claimed is:

1. An improved switching state retention circuit having an input region and an output region and being capable of retaining selected switching states introduced therein, said circuit comprising a loop access means, having an input region electrically connected to said switching state retention circuit input region and having an output region, where said loop access means is capable of having said output region thereof being at a selected voltage level state in response to signals on said loop access means input region; and further comprising a plurality of loop device means, each having an input region and an output region, where said input regions of each of said loop device means other than an initial loop device means are electrically connected to said output regions of another said loop access means other than a last loop device means to thereby form a series string of loop device means, and where said initial loop device means has said input thereof electrically connected to said loop access means output region, said string of loop device means providing a voltage level state on said last loop device means output region which is substantially similar to that voltage level state occurring on said initial loop device means input region absent signal transient effects; and yet further comprising a transmission switch means, having first and second terminating regions and a control region by which said transmission switch means is capable of being directed to provide a conductive path between said transmission switch means first and second terminating regions, where said transmission switch means first terminating region is electrically connected to said initial loop device means input region and said transmission switch means second terminating region is electrically connected to said last loop device means output region, said improvement comprising:

a capacitance means electrically connected between a selected said loop device means output region and a first terminal means adapted for electrical connection to a first source of voltage.

2. The apparatus of claim 1 wherein each of said loop device means is an inverter device having an input region and an output region, said inverter device, if electrically energized, having said output region thereof in a voltage level state opposite that occurring on said input region thereof.

3. The apparatus of claim 1 further comprising an output buffer inverter device having an output region and having an input region electrically connected to said loop access means and said transmission switch means output regions, said output buffer inverter device, if electrically energized, having said output region thereof at a voltage level state opposite that occurring on said output buffer inverter device input region, said output inverter device output region being electrically connected to said switching state retention circuit output region.

4. The apparatus of claim 1 wherein said capacitance means is electrically connected to said last loop device means output region.

5. The apparatus of claim 2 wherein said loop access means is a controlled inverter device having an enable input region, said controlled inverter device, if electrically energized, having said output region thereof in a voltage level state opposite that occurring on said input region thereof for said enable input region thereof being in one voltage state but, for said enable input region thereof being in an opposite voltage state, said output region is in a voltage state independent of changes in voltage state in said input region.

6. The apparatus of claim 5 wherein each said inverter device serving as a loop device means is formed of a p-channel MOSFET and a n-channel MOSFET having common drain electrical interconnections and common gate electrical interconnections.

7. The apparatus of claim 6 wherein said controlled inverter device serving as said loop access means is formed of first and second p-channel MOSFET's having said first p-channel MOSFET at its drain electrically connected to said second p-channel MOSFET at its source, and of first and second n-channel MOSFET's having said first n-channel MOSFET at its drain electrically connected to said second n-channel MOSFET at its source, said second p-channel MOSFET drain and said second n-channel MOSFET drain being electrically connected in common, said first p-channel MOSFET gate and said first n-channel MOSFET gate being electrically connected in common, and with a gate selected from said second p-channel MOSFET and said second n-channel MOSFET gates serving as said enable input region.

* * * * *